United States Patent [19]

Cooper, Jr. et al.

[11] Patent Number: 5,465,249

[45] Date of Patent: Nov. 7, 1995

[54] NONVOLATILE RANDOM ACCESS MEMORY DEVICE HAVING TRANSISTOR AND CAPACITOR MADE IN SILICON CARBIDE SUBSTRATE

[75] Inventors: James A. Cooper, Jr., West Lafayette, Ind.; John W. Palmour; Calvin H. Carter, Jr., both of Cary, N.C.

[73] Assignees: Cree Research, Inc., Durham, N.C.; Purdue Research Foundation, Lafayette, Ind.

[21] Appl. No.: 798,219

[22] Filed: Nov. 26, 1991

[51] Int. Cl.$^6$ ............................................. G11C 11/401
[52] U.S. Cl. ........................ 365/149; 365/180; 365/177; 257/77
[58] Field of Search ..................... 365/180, 149, 365/174, 177; 257/77, 78, 23, 24, 76, 197, 289, 593

[56] References Cited

U.S. PATENT DOCUMENTS

| | | | |
|---|---|---|---|
| 3,876,992 | 4/1975 | Pricer | 365/149 |
| 4,183,040 | 1/1980 | Rideout | 257/389 |
| 4,635,083 | 1/1987 | Cooper, Jr. | 257/183.1 |
| 4,751,201 | 6/1988 | Nottenburg et al. | 437/225 |
| 4,866,005 | 9/1989 | Davis et al. | 437/100 |
| 4,875,083 | 10/1989 | Palmour | 257/77 |
| 4,912,063 | 3/1990 | Davis et al. | 437/100 |
| 4,912,064 | 3/1990 | Kong et al. | 437/100 |
| 4,947,218 | 8/1990 | Edmond et al. | 257/77 |
| 4,975,750 | 12/1990 | Hayashi et al. | 257/474 |
| 4,981,551 | 1/1991 | Palmour | 156/643 |

FOREIGN PATENT DOCUMENTS

WO08617  11/1988  WIPO.
WO89/04056  5/1989  WIPO ................. 257/77

OTHER PUBLICATIONS

Rutz, "Bistable Switch with Nonvolatile Memory States", IBM TDB, vol. 13, No. 11, Apr. 1971, pp. 3305–3306.
Dungan et al., "A Thermal–Generation–Limited Buried–Well Structure for Room–Temperature Gas Dynamic RAM's", EDL, vol. IEDL–8, 5 May 1987, pp. 243–245.
Bedair et al., "Extremely Low Leakage GaAs P–I–N Junctions and Memory Capacitors Grown by Atomic Layer Epitaxy", IEDL, vol. 11, No. 6, Jun. 1990, pp. 261–263.
"High Density Memories" by Peter M. Quinn, et al., ISSCC, Feb. 16, 1978.
"VLSI Fabrication Priciples" by Sorab K. Ghandhi, Native Oxide Films, pp. 400–401; no date.
"Proposed Process Modifications for Dynamic Bipolar Memory to Reduce Emitter–Base Leakage Current" by Ignor Antipov, *Transactions On Electron Devices*, vol. ED–27, No. 8, Aug. 1980, pp. 1649–1654.
"3–Dimensional Stacked Capacitor Cell For 16M and 64M Drams" by T. Eno, et al., *IEEE*, 1988; pp. 592–595.
"A Buried–Trench DRAM Cell Using A Self–aligned Epitaxy Over Trench Technology" by C. Lu, et al., *IEEE*, 1988, pp. 588–591.
"Memory II" by Thomas A. Longo, IEEE International Solid–State Circuits Conference, 1976, pp. 182–183.
"Cell Structures For Future Drams" by Hideo Sunami, Central Research laboratory, Hitachi Ltd. Kokubunji, Tokyo 185, Japan, IEEE, 1985, pp. 694–697.

*Primary Examiner*—David C. Nelms
*Assistant Examiner*—Andrew Q. Tran
*Attorney, Agent, or Firm*—Bell, Seltzer, Park & Gibson

[57] ABSTRACT

A random access memory (RAM) cell in 6H–SiC having storage times when all bias is removed long enough to be considered nonvolatile. The nonvolatile random access memory (NVRAM) cell comprises a bit line, a charge storage device in silicon carbide, and a transistor in silicon carbide connecting the charge storage device to the bit line. The bipolar NVRAM cell has a bipolar transistor with a base region, an emitter region, and a floating collector region, wherein the charge storage device in the bipolar NVRAM is a p–n junction adjacent the floating collector region of the cell. The metal-oxide-semiconductor (MOS) NVRAM has a MOS field effect transistor (MOSFET) with a channel region, a source region, and a drain region, wherein the charge storage device in the MOS NVRAM is a MOS capacitor adjacent the drain region of the MOSFET.

35 Claims, 8 Drawing Sheets

NONVOLATILE RANDOM ACCESS MEMORY DEVICE HAVING TRANSISTOR AND CAPACITOR MADE IN SILICON CARBIDE SUBSTRATE

FIELD OF THE INVENTION

This invention was made at least partially with government support under the Office of Naval Research, Contract Numbers N00014-89-J-1864, N00014-880527, and N00014-90-C-0038. The government may have certain rights in this invention. This invention generally relates to semiconductor memories and more particularly to a nonvolatile dynamic random access memory formed in silicon carbide, each cell of which comprises a transistor and a charge storage device.

BACKGROUND OF THE INVENTION

In general, semiconductor memories may be divided into three classes: random-access memories (RAM's), read-only memories (ROM's), and programmable read-only memories (PROM's). RAM's are used to store large volumes of data which must be read and written at high speeds. ROM's may not be electrically written; they store data which may be read at high speeds but not changed by the system during operation. PROM's may be erased and reprogrammed, but only at very slow rates, so that reprogramming is not feasible during system operation. In effect, PROM's may be regarded as ROM's which may be programmed once (or at most a few times) by the user.

There are two important operating characteristics which describe semiconductor memories: (i) volatility, and (ii) writability. Volatility refers to the time period over which a memory will store data. A memory is said to be nonvolatile if the data is retained for a useful period of time after power is removed. Both ROM's and PROM's are nonvolatile. Writability refers to the ability of the memory to be written with new data at high speeds by the system during operation, i.e., the ability to store data which is the result of calculations performed by the system or new data to be processed by the system. In this sense, RAM's are writable, but ROM's are not.

Thus, RAM's offer writability, but not nonvolatility. ROM's are nonvolatile, but also nonwritable.

Another memory alternative are the dynamic random access memories, or DRAM's, which are widely used in modern digital computing systems for high-speed data storage and retrieval. In a DRAM, the data storage is said to be "dynamic," because data is retained only for a relatively short time, typically on the order of a few seconds at room temperature. The basic DRAM cell consists of an access transistor and a storage capacitor. Data is written into the cell by turning on the access transistor so that the potential applied to the bit line is connected directly to the storage capacitor. When the access transistor is turned off, the storage capacitor remains charged to the potential of the bit line until unwanted leakage currents slowly discharge it. See articles by Sander et al. entitled High Density Memories, Institute for Electronic and Electrical Engineers International (IEEE) Solid-State Circuits Conference, Digest of Technical Papers, pp. 182–83, 1976, and by Antipov entitled Proposed Process Modifications for Dynamic Bipolar Memory to Reduce Emitter-Base Leakage Current, IEEE Transactions on Electron Devices, Vol. ED-27, No. 8, pp. 1649–54, 1980.

The "storage time" of a DRAM cell is an important parameter of the cell. Since the data decays, the memory controller must periodically read and rewrite the contents of each cell in the array, a process referred to as "refresh." Typical refresh rates in modern systems are around 1 kilohertz (kHz), requiring storage times greater than about 20 milliseconds (ms). In spite of the system overhead imposed by the refresh requirement, DRAM's are widely used because of their simplicity and small cell size. For DRAM configurations described above, see articles by Quinn et al. entitled High Density Memories, IEEE International Solid-State Conference, 1978, and by Sunami entitled Cell Structures for Future DRAM's, IEEE IEDM, pp. 694–97, 1985. DRAM's also have the added advantage of dissipating almost no static power while storing data.

The advantages of DRAM's are best appreciated in comparison to programmable read-only memories (PROM's). PROM's are nonvolatile, but may not be electrically written during operation, that is, they do not have writability. PROM's typically store data by transferring charge to a region isolated by a large potential barrier. This region typically takes the form of either a floating gate surrounded by an insulating barrier of silicon dioxide in a metal-oxide-semiconductor field-effect transistor (MOSFET) geometry. Charge is transferred to and from the floating gate by avalanche injection of electrons over or tunneling through the potential barrier of the oxide at high electric fields. Because the potential barrier is very large, leakage is negligible at normal operating temperatures, and storage is nonvolatile.

Electrical readout of the stored data is accomplished by detecting the current in the underlying MOSFET; in effect, the floating gate shifts the threshold voltage of the MOSFET, altering the current. Reading is therefore very fast. There are a great variety of similar structures, all operating on a similar basic principle. See text in publication by Sze entitled "Nonvolatile Memory Devices" Physics of Semiconductor Devices, pp. 496–506, John Wiley & Sons, Inc., New York, 1981. For example, some devices store charge in deep traps within a special dual-dielectric insulator, rather than on an electrode. Examples are the MNOS (for metal-nitride-oxide-semiconductor) memory and the doped-interface dual-dielectric storage cell (where charge is stored on a submonolayer of metal atoms deposited at the dielectric interface).

Unfortunately, all these memories suffer from two important drawbacks. First, as already pointed out, writing data into the memory is very slow (typically one-tenth of a millisecond for each cell). Second, all these devices are subject to a "wearout" mechanism, in which the cell's operation degrades after about $10^6$–$10^7$ write operations. If the memory is only reprogrammed a few times, this wearout mechanism does not present any difficulties. Any attempt, however, to use this type of cell as a read/write memory would quickly exceed the wearout limit of the dielectric, since $10^6$ writing operations may typically take place in just a few seconds in a high-speed computing system.

These properties are summarized for the three memory types in the table below. This table demonstrates that no existing semiconductor memory presently exists that is both nonvolatile and writable during operation.

|  | RAM's | ROM's | PROM's |
| --- | --- | --- | --- |
| Nonvolatile? | NO | YES | YES |
| Writable During Operation? | YES | NO | NO |

Although most of the DRAM development during the past decade has been in silicon, there have been attempts at developing one-transistor DRAM cells in wider-bandgap semiconductors such as gallium arsenide (GaAs). Recently, it has been demonstrated that 4-6 hour storage times in GaAs are feasible at room temperature. Such long storage times are the result of the higher bandgap (1.42 electron volts (eV)) of GaAs as compared to silicon (1.12 eV).

Unfortunately, GaAs devices are not able to retain memory more than the 4-6 hour time without refresh because the charge is slowly dissipated due in part to the thermally generated leakage current in GaAs over this time period. Also, GaAs devices are dominated by leakage currents at the exposed sidewalls because no native oxide exists for the GaAs structure (i.e., GaAs lacks passivation capability). This surface leakage reduces the storage time of the GaAs devices.

Thus, there presently exist no DRAM's for which memory storage without refresh may be maintained indefinitely.

OBJECT AND SUMMARY OF THE INVENTION

Therefore, it is an object of the present invention to provide a semiconductor memory device that is both writable and nonvolatile.

It is another object of the present invention to provide a semiconductor memory device that is not subject to cell degradation after a high number of write operations to the cell.

It is also an object of the present invention to provide a semiconductor memory device with increased storage time by using a wide-bandgap semiconductor, where leakage currents are inherently low.

The present invention meets these objects with a nonvolatile random access memory (NVRAM) cell that has two structural configurations, bipolar and metal-oxide-semiconductor (MOS). The bipolar NVRAM cell has a first region of silicon carbide with a first conductivity type. A second region of silicon carbide is layered upon the first region defining a floating collector region and has an opposite conductivity type from the first region. A third region of silicon carbide is layered upon the second region defining a base region and has a same conductivity type as the first region. A fourth region of silicon carbide is layered upon the third region and has a same conductivity type as the second region. The first region and the floating collector region form a charge storage device, and the floating collector, base, and emitter regions together form a bipolar transistor.

The metal-oxide-semiconductor (MOS) NVRAM cell has a first conductivity type first region of silicon carbide. An opposite conductivity type second region of silicon carbide is formed in the first region for defining a source region. A third region of silicon carbide of the same conductivity type as the second region is also formed in the first region and separated from the second region for defining a drain region. An insulating layer is placed on the source region, the drain region, and the first region therebetween. A gate layer is placed on the insulating layer between the source and the drain regions for defining a channel region in the first region between the source and the drain when a positive bias is applied to the gate layer, so that the source, the channel, and the drain regions together define a metal-oxide-semiconductor field effect transistor (MOSFET). A conductive layer is placed on the insulating layer above the drain region for defining a MOS capacitor.

DETAILED DESCRIPTION

The present invention now will be described more fully hereinafter with reference to the accompanying drawings in which a preferred embodiment of the invention is shown. This invention may, however, be embodied in many different forms and should not be construed as limited to the embodiment set forth herein; rather, this embodiment is provided so that this disclosure will be thorough and complete and will fully convey the scope of the invention to those skilled in the art. Like numbers refer to like elements throughout.

Although the excellent properties of SiC have been known for many years, the use of SiC as a semiconductor has been very limited, primarily due to problems with crystal quality and size. Major breakthroughs in technology have recently been made for the production of commercially viable semiconductor devices from SiC. See U.S. Pat. No. 4,912,064 entitled Homoepitaxial Growth of Alpha-SiC Thin Films and Semiconductor Devices Fabricated Thereon, by Kong et al., U.S. Pat. No. 4,981,551 entitled Dry Etching of Silicon Carbide, by Palmour, U.S. Pat. No. 4,866,005 entitled Sublimation of Silicon Carbide to Produce Large, Device Quality Single Crystals of Silicon Carbide, by Davis et al., U.S. Pat. No. 4,947,218 entitled P-N Junction Diodes in Silicon Carbide, by Edmond et al., U.S. Pat. No. 4,912,063 entitled Growth of Beta-SiC Thin Films and Semiconductor Devices Fabricated Thereon, by Davis et al., and U.S. Pat. No. 4,875,083 entitled Metal-Insulator-Semiconductor Capacitor Formed on Silicon Carbide, by Palmour illustrating such advances in the SiC technology.

Figure 1A:
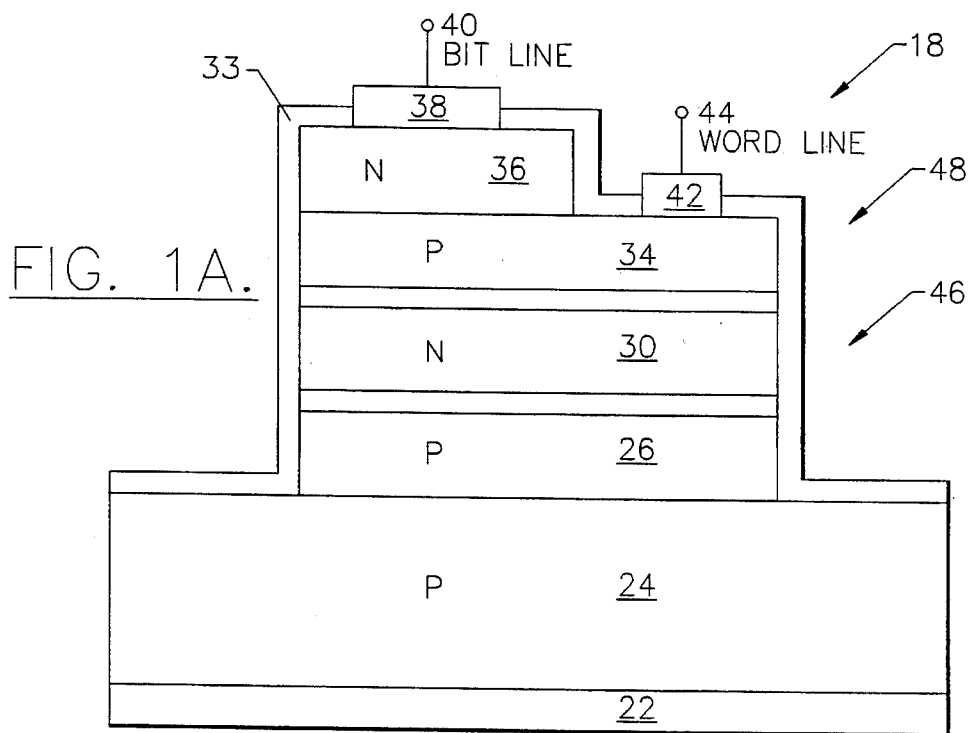
FIGS. 1(a)-1(c) schematically illustrate the bipolar nonvolatile random access memory (NVRAM) cell structure according to the present invention.

Referring now to FIG. 1(a), the basic bipolar NVRAM cell structure 18 consists of four regions of alternating doping type silicon carbide upon a p-type 6H-SiC substrate 24. A p-type first region of SiC is formed on the substrate 24. The substrate has a first ohmic contact 22 to a ground potential. The first ohmic contact 22 is preferably an aluminum alloy for p-type SiC substrates and nickel (Ni) for n-type SiC substrates. A first layer 28 of undoped SiC is formed on the p-type first region 26 for reducing leakage currents flowing from the p-type first region 26. An n-type second region 30 of SiC is formed on the p-type first region 26 to define a floating collector region of a bipolar transistor generally shown at 48. A second layer 32 of undoped SiC is formed on the n-type second region 30 also for reducing leakage currents flowing from the second region 30. An p-type third region 34 of SiC is then formed on the second layer 32 of undoped SiC to define a base region of the bipolar transistor 48. An n-type fourth region 36 of SiC is formed on the third region 34 to define an emitter region of the bipolar transistor 48. This four region structure 18 may be viewed as an n-p-n bipolar transistor 48 with a floating collector 30, where the floating collector 30 is capacitively connected to ground through a reverse-biased p-n-p junction capacitor generally shown at 46. The exposed sidewalls of the four region structure and the exposed surface of the substrate 24 are layered with a layer 33 of silicon dioxide ($SiO_2$) to reduce leakage currents from these areas. A second ohmic contact 38, preferably Ni, is made on the emitter region 36 to connect a bit line 40 of an array of memory cells for writing information to storage when a potential is applied thereto. A third ohmic contact 42, preferably an aluminum alloy, is made on the base region 34 to connect a word line 44 of an array of memory cells. No electrical contact is made to the n-type floating collector region 30.

Figure 1B:
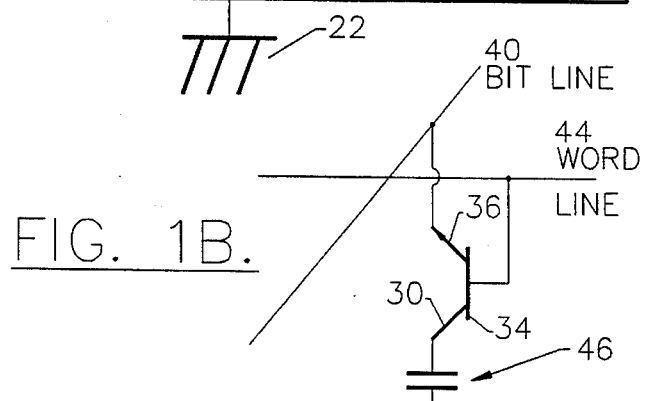

Referring now to FIG. 1(b), which illustrates the circuit diagram of the corresponding bipolar transistor 48, the NVRAM cell 18 comprises a bit line 40 for writing information to storage when a potential is applied to the line, a storage capacitor 46, and an emitter region 36 of the bipolar transistor 48 electrically connecting the capacitor 46 with the bit line 40. A word line 44 is electrically connected to the base region 34 of the bipolar transistor 48.

The operation of the bipolar DRAM cell may be understood with reference to the band diagrams of FIG. 2. In equilibrium, the Fermi level is flat across the four region structure 18, as shown in FIG. 2(a). To remove electrons from the n-type floating collector region 30, FIG. 2(b), the base region 34 and the emitter region 36 are taken positive, forward-biasing the collector-base junction and causing electrons to diffuse across the base region 34 into the emitter region 36. There is no steady state current flow, since the n-type floating collector region 30 is isolated by the reverse-biased diode to the p-type first region 26. As a result, electrons flow from the floating collector region 30 only until the collector reaches the positive potential of the word line 44. At this point, the collector-base junction is no longer forward biased, and writing is complete.

Figure 2A:
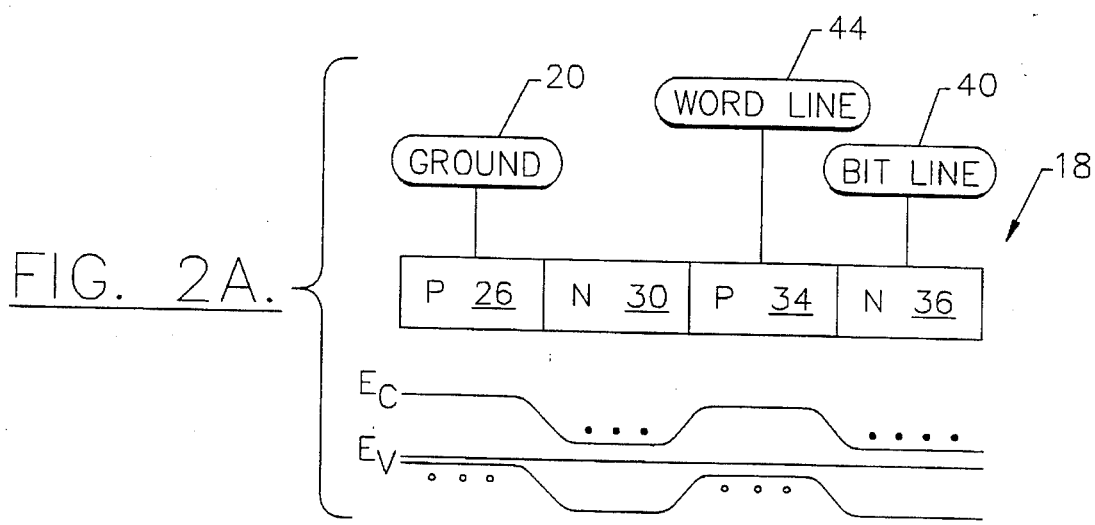
FIGS. 2(a)-2(d) schematically illustrate the band diagrams of the n-p-n bipolar NVRAM cell according to the present invention.
Figure 2B:
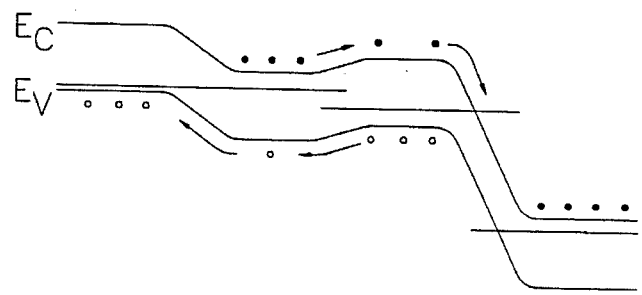
Figure 2C:
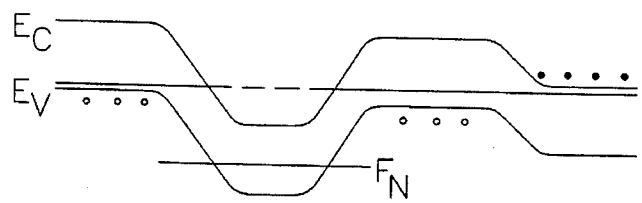
Figure 2D:
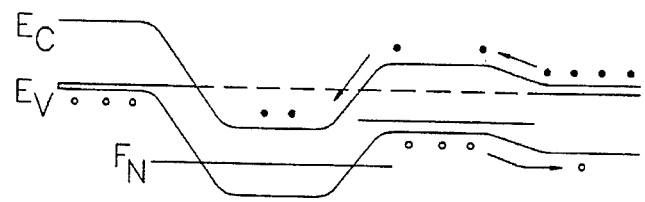

When the base region 34 and the emitter region 36 are returned to ground, FIG. 2(c), the floating collector regions 30 remains at a positive potential, and is effectively reverse-biased with respect to the p-regions on either side, which are both at ground potential. The floating collector region 30 remains at a positive potential until thermal generation of electron-hole pairs in the depletion regions of the reverse-biased junctions gradually replenish the electrons which were removed. This process is exceedingly slow in a wide-bandgap semiconductor such as SiC. To reinsert electrons, the base region 34 (connected to the word line 44) is taken slightly positive, forward biasing the emitter-base junction and allowing electrons to diffuse across the base region 34 to the floating collector region 30, as shown in FIG. 2(d).

The bipolar NVRAM cell stores data when both the word line 44 and the bit line 40 are at ground potential (parts (a) and (c) of FIG. 2). The implication of this fact is that data is stored with no voltage applied to the semiconductor memory device. As a result, this type of memory is considered nonvolatile to temporary power interruptions, provided these interruptions are short compared to the normal storage time of the cell.

Figure 1C:
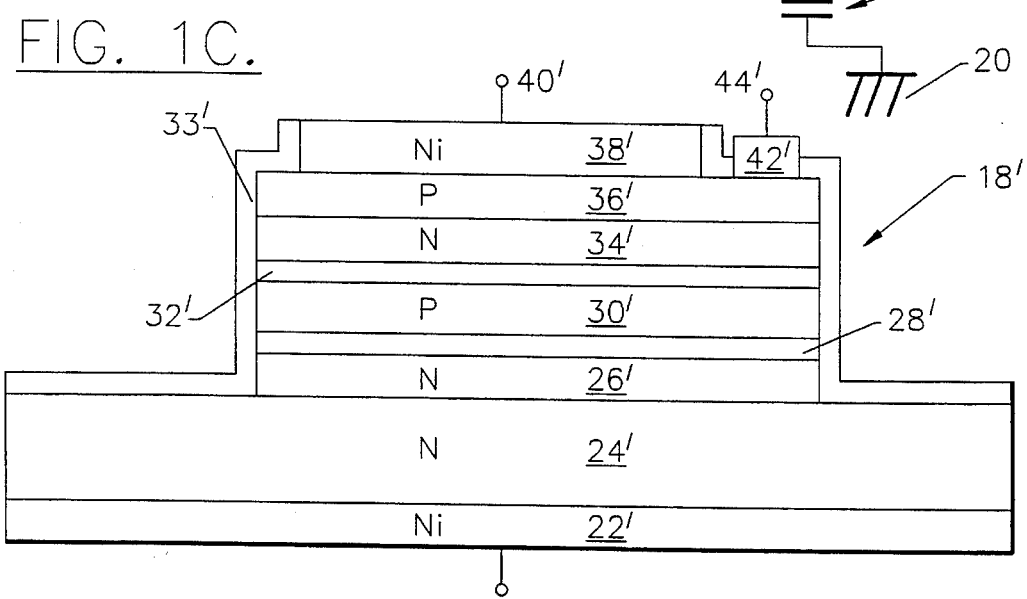

The operation of such a nonvolatile device was confirmed with a configuration essentially the same as that illustrated in FIG. 1(a), except using the n-p-n storage capacitor layering, generally shown at 18', of FIG. 1(c). Additionally, and as known to those of ordinary skill in the art, silicon carbide crystallizes in many different variations called polytypes. The NVRAM of the present invention may be formed in a number of these various polytypes including the 3C, 2H, 4H, 6H, and 15R polytypes.

Referring again to FIG. 1(c), the NVRAM cell 18' is constructed in SiC, and its operation is verified by monitoring the capacitance between the n+ base region 34' and the n-type substrate 24'. In order to assure that the floating collector region 30' is at zero bias with respect to the substrate 24', the cell 18' is exposed to light for time t<0, causing the n-p-n junctions of the storage node to become slightly forward biased. The exposure to light is not required for memory performance purposes, but is used to verify sample performance here. At time t=0, the light is removed and the recombination of excess carriers returns the cell 18' to its zero-bias equilibrium value.

After several thousand seconds, a positive pulse is applied to the line 40' causing a sharp decrease in the capacitance of the cell 18'. When the bias is later removed, an exponential capacitance recovery is observed. The storage time of a cell is defined as the time required for the capacitance to return to within 1/e (where e is the base for natural or Napierian logarithms) of its equilibrium value.

Figure 3A:
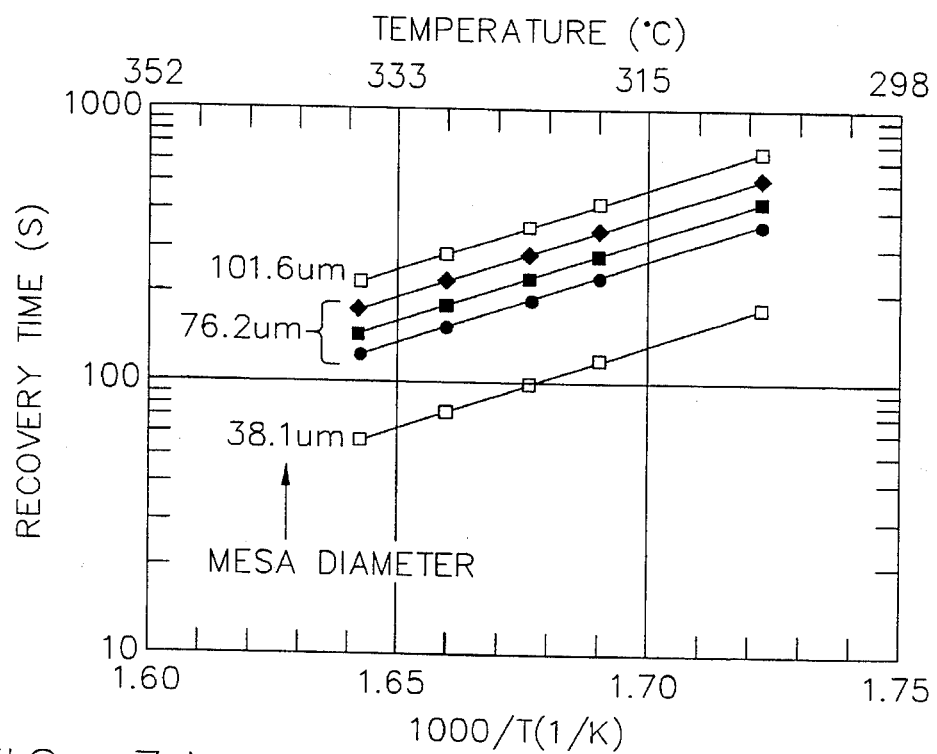
FIGS. 3(a) and 3(b) graphically illustrate the recovery time versus temperature for three different size SiC samples.
Figure 3B:
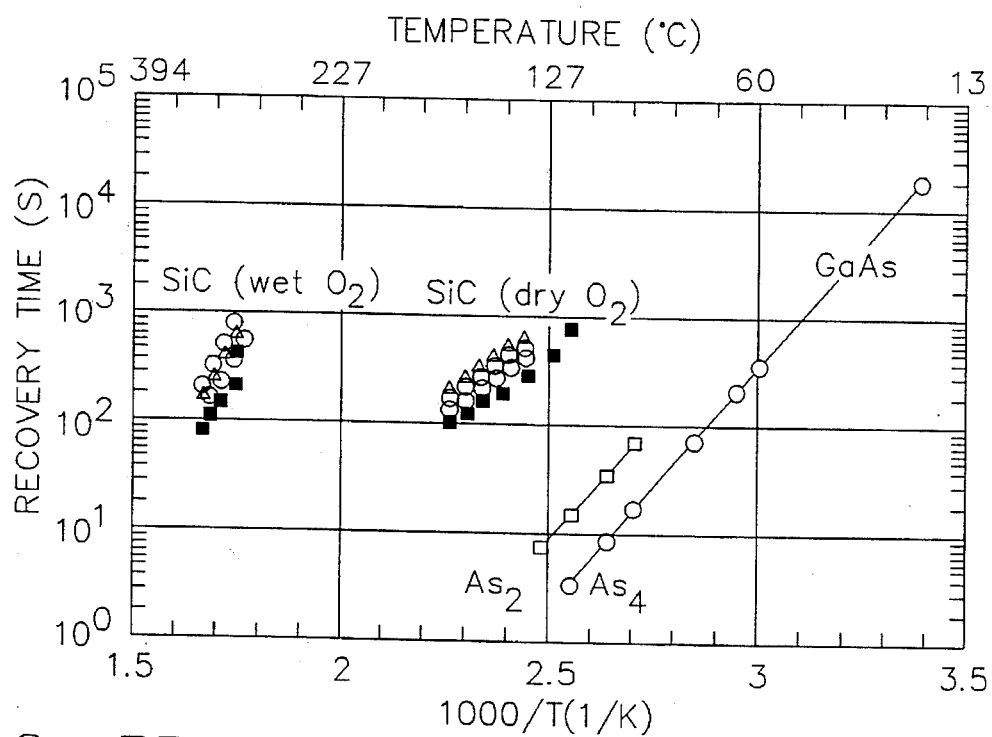

Referring now to FIGS. 3(a) and 3(b), there is graphically illustrated the recovery time ($\tau_s$) versus temperature for three different size n-p-n SiC storage capacitor cells, as shown in FIG. 1(c), having diameters of 38.1 μm, 76.2 μm, and 101.6 μm. An activation energy, $E_A$, for the generation process is determined from an exponential fit to this data using the equation:

$$\tau_s = C_1 e^{(\frac{E_A}{k_B T})} \qquad (1)$$

where $C_1$ is a proportionality constant, $k_B$ is the Boltzmann constant, and T is the absolute temperature. The recovery process was thermally activated with an activation energy of about 1.48 eV, very close to half the bandgap. Note in FIG. 3(a) that the smaller cells exhibited shorter recovery times. Because recovery time is related to cell or device size, perimeter thermal generation is significant. From the perimeter generation rates in FIG. 3(a), an activation energy of 1.55 eV was determined.

The inventors, therefore, investigated this perimeter generation relationship to determine if the recovery times were sensitive to oxidation conditions used to passivate the cell edges. The results in FIG. 3(a) used wet oxidation and a second lot was used for dry oxidation. FIG. 3(b) graphically compares the recovery time versus the temperature for the SiC cells in both dry oxidation and wet oxidation. Both samples were thermally activated, but the dry-oxide samples exhibited comparable recovery times at much lower temperatures than the wet-oxide samples. The activation energy was also reduced to between 0.6 and 0.8 eV. Also shown in FIG. 3(b) are recovery times measured on similar structures in GaAs. Clearly, charge recovery in SiC is much longer than in GaAs.

Figure 4:
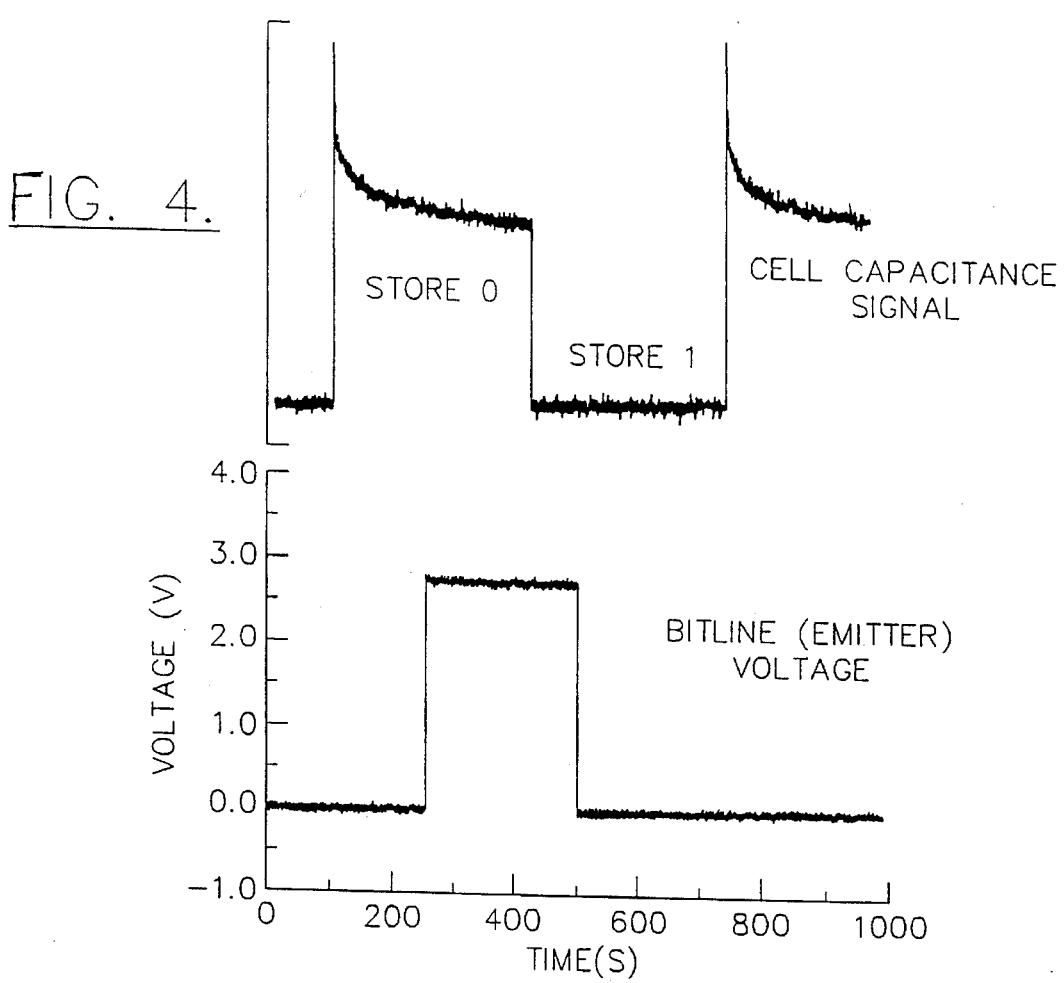
FIG. 4 graphically illustrates writing of the bipolar NVRAM cell according to the present invention.

Writing to the cell 18 through the access transistor 48 is now demonstrated in FIG. 4 for illustrative purposes. The top waveform is the room temperature capacitance of the cell 18 measured between the word line 44 (base) and the substrate contact 22, and the bottom waveform is the voltage applied to the bit line 40 (emitter) contact. On this time scale, 100 seconds per division, the short one-millisecond word line pulses are not captured on a digitizing oscilloscope and, therefore, are not shown in this figure. These three-volt, one-millisecond word line pulses occur when there is an abrupt change in the capacitance signal. The data on the bit line 40 is written into the cell 18 during each word line pulse.

Initially, a logic one is stored in the NVRAM cell 18, and a low capacitance is measured. During the first pulse, the bit line voltage is low, and the capacitance rises, indicating that the cell 18 has returned to its zero-bias equilibrium state. The capacitance decay at this point is due to the turn-off time of the forward biased base-collector p-n junction. Likewise, during the second word line pulse, when the bit line voltage is high, the capacitance falls, indicating charge has been removed from the storage capacitor.

The stored information may be read electrically by monitoring the bit line voltage with a low-capacitance active probe. In an integrated NVRAM or an array of NVRAM cells, this voltage difference is detected by sense amplifiers and latched for data readout. The speed of this new memory is comparable to the fastest silicon dynamic memories available today.

The bipolar NVRAM cell 18 in 6H-SiC has an important structural difference from previously known GaAs DRAM's, which greatly improves the storage time in SiC. This is the use of a high-quality thermal $SiO_2$ passivation for all exposed semiconductor surfaces, particularly the mesa sidewalls. As stated earlier, GaAs memory devices are dominated by thermal generation at the exposed sidewalls, and this generation is much lower in SiC devices due to the oxide passivation.

A hierarchy of one-transistor MOS NVRAM cells is shown in FIG. 5. These cells are illustrated in terms of n-channel MOSFET's. P-channel MOSFET's are also appropriate. It is understood that the descriptions of n-channel MOSFET operation in FIG. 5 apply equally to p-channel MOSFET operation if all dopings and voltages are inverted. Also, the invention is applicable to complimentary metal-oxide-semiconductor (CMOS) RAM devices as well.

Figure 5A:
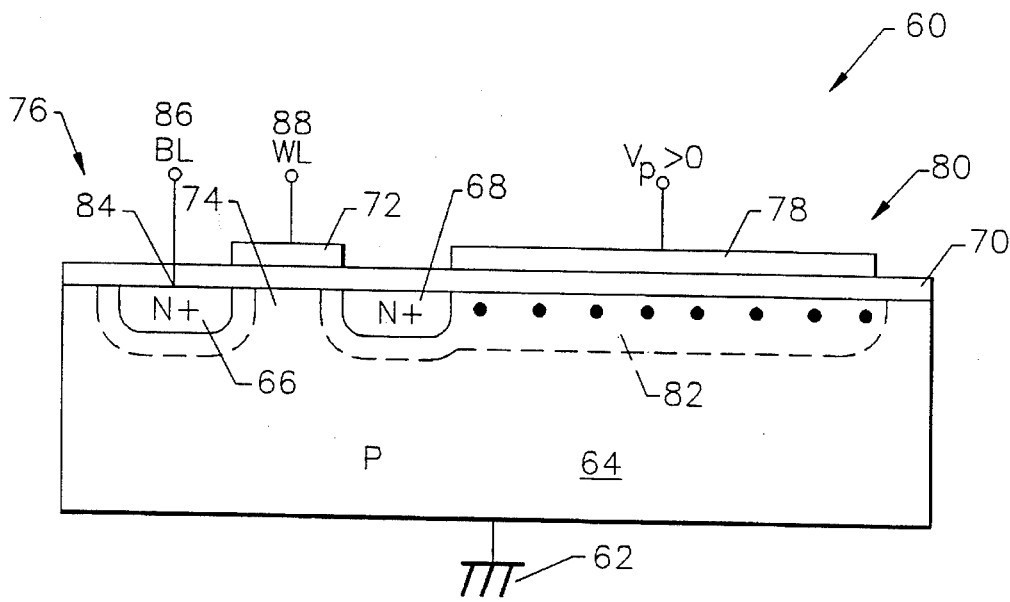
FIGS. 5(a)-5(d) schematically illustrate the nonvolatile MOS random access memory cell according to the present invention.

The NVRAM cell 60 in FIG. 5(a) comprises a p-type first region 64 of silicon carbide connected to a ground potential 62. An n-type second region 66 of silicon carbide is formed in the p-type first region 64 to define a source region. In particular, the n-type second region 66 is implanted, but similar results may also be achieved by epitaxial growth of an n+ layer and reactive ion etching to form n+ mesas for the cells generally. An n-type third region 68 of silicon carbide is also implanted in the p-type first region 64 to define a drain region. A portion of the p-type first region 64 is between the second region 66 and the third region 68. A silicon dioxide layer 70 is formed on the p-type first region 64 as both an insulating layer and an oxide passivation layer.

A gate contact layer 72 is formed on the silicon dioxide layer 70 between the source region 66 and the drain region 68 to define a channel region 74 in the p-type first region 64 between the source region 66 and the drain region 68. When a positive bias is applied to the gate contact layer 72, the source region 66, the drain region 68, and the channel region 74 together define a metal-oxide-semiconductor field effect transistor (MOSFET) generally shown at 76.

A conductive contact layer 78 is also formed on the silicon dioxide layer 70 adjacent the drain region 68 of the MOSFET 76 to define a metal-oxide-semiconductor (MOS) capacitor, generally shown at 80, adjacent the drain region 68. When a positive bias is applied to the gate contact layer 72 of the MOSFET 76, the bias encourages carriers to flow between the source region 66 and the drain region 68 such that the drain region 68 and an inversion layer 82 of the adjacent MOS capacitor 80 form a single active region for the MOS capacitor 80 under such bias.

An ohmic contact 84 for a bit line 86 is made to the source region 66 for reading and writing information to the MOS DRAM cell 60. A word line 88 is attached to the gate contact layer 72 for biasing the MOSFET 76 to address bit line data from the bit line 86.

The conductive contact layer 78 of the MOS capacitor 80 has a sufficient potential such that a substantial inversion layer 82 of electrons may be contained at the interface below the capacitor contact layer 78 in the p-type first region 64. The presence or absence of an inversion layer 82 indicates a logical "one" or logical "zero" stored in the cell 60.

To write data into the cell 60, the word line 88 is taken positive, turning the MOSFET 76 on and connecting the inversion layer 82 of the MOS storage capacitor 80 to the bit line 86. If the bit line 86 is positive, electrons will be drawn out of the inversion layer 82 into the bit line 86, resulting in an empty inversion layer 82 (logic "one").

If the bit line 86 is near ground, electrons will flow from the bit line 86 into the inversion layer 82 of the MOS storage capacitor 80, resulting in a "full" inversion layer 82 (logic "zero"). The "full" inversion layer 82 is the equilibrium state of the cell 60, and never decays. The "empty" inversion layer however, gradually fills up with electrons due to thermal generation in the depletion region or single active region under the MOS storage capacitor 80. The MOS storage capacitor 80 is isolated from the bit line 86 when the word line 88 returns to ground.

A practical problem with the structure of FIG. 5(a) is that the ion-implanted n+ drain implanted region 68 is in electrical contact with the inversion layer 82 of the MOS storage capacitor 80. Thus, generation current arising from unannealed damage in the implanted drain region 68 may reduce the storage time. This difficulty is alleviated by the cell structure 92 of FIG. 5(b). Here the n+ drain diffusion region 68 of FIG. 5(a) was eliminated, and the conductive contact layer 78 of the MOS storage capacitor 80 was placed sufficiently close to the gate contact layer 72 of the MOSFET 76 that a continuous inversion layer 94 existed between them. For typical substrate dopings and oxide thicknesses, a gap on the order of 1 µm is required.

Figure 5B:
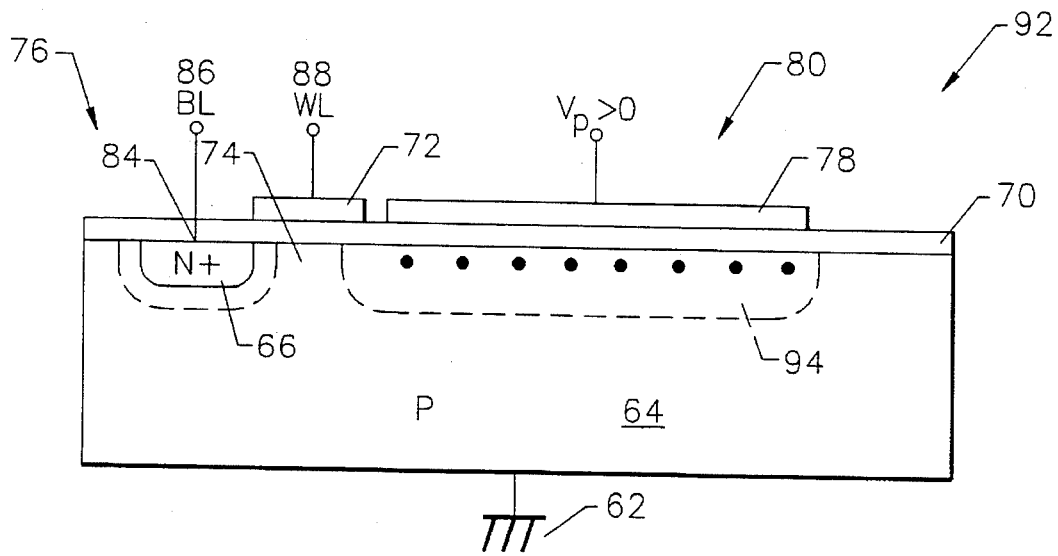
Figure 5C:
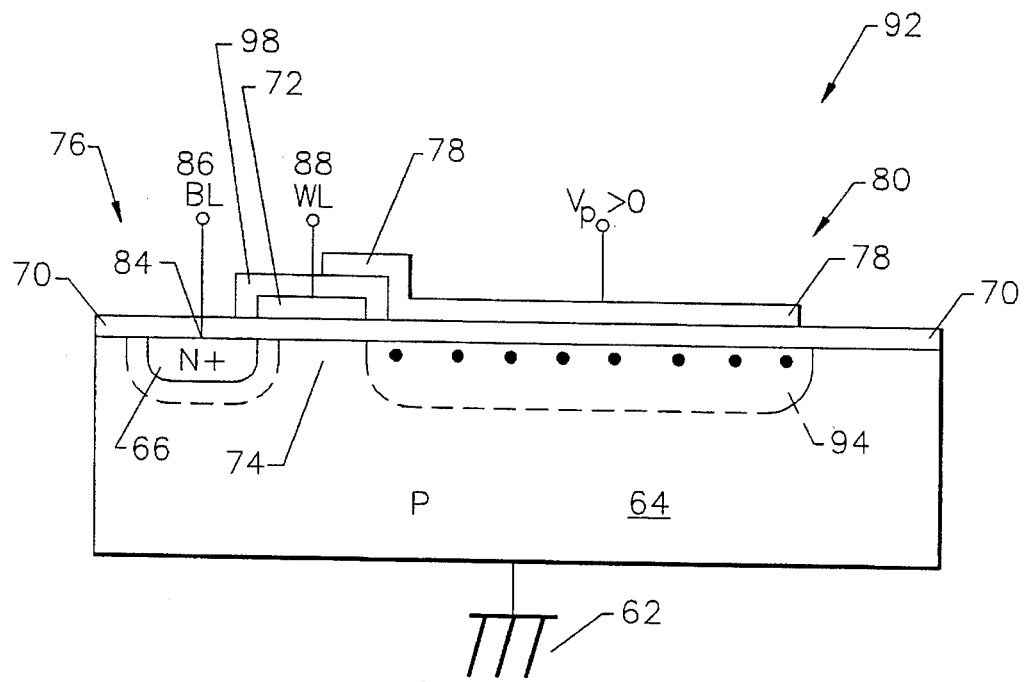

The need for fine-line lithography in the cell structure 92 of FIG. 5(b) may be relaxed if the gate contact layer 72 of the MOSFET 76 is polysilicon. In this case, the polysilicon gate contact layer 72 may be partially oxidized and the conductive contact layer 78 of the MOS storage capacitor 80 deposited on the intermediate oxide layer 98, as shown in FIG. 5(c). Here, the small spacing between the gate contact layer 72 of the MOSFET 76 and the MOS storage capacitor 80 is automatically provided by the intermediate oxide layer 98 formed by oxidation of the polysilicon. All three of these structures (FIGS. 5(a)–5(c)) are practical.

The cell structures shown in FIGS. 5(a)–5(c), however, require that a positive bias $V_p>0$ be maintained on the conductive contact layer 78 of the MOS storage capacitor 80 to create the potential well or inversion layer 82 to confine electrons. Because of this requirement the cell is not considered nonvolatile—if all power is removed, the electrons in the inversion layer 82 spill into the p-type first region 64 and recombine with holes. These cells, however, do have an extended memory capability such that the time before refresh is required is much longer than other known DRAM devices.

There are two possible approaches to circumvent this refresh problem. The first is to shift the threshold of the MOS storage capacitor 80 to a negative value by ion implantation. This solution is unattractive because of the lattice damage caused by ion implantation. The second approach is to extend the n+ implanted region 68 under the silicon dioxide layer 70 of the MOS storage capacitor 80. If this is done, there is no need to create a potential well at the surface to contain the inversion layer 82, and $V_p$ may be tied to a ground potential 100.

Figure 5D:
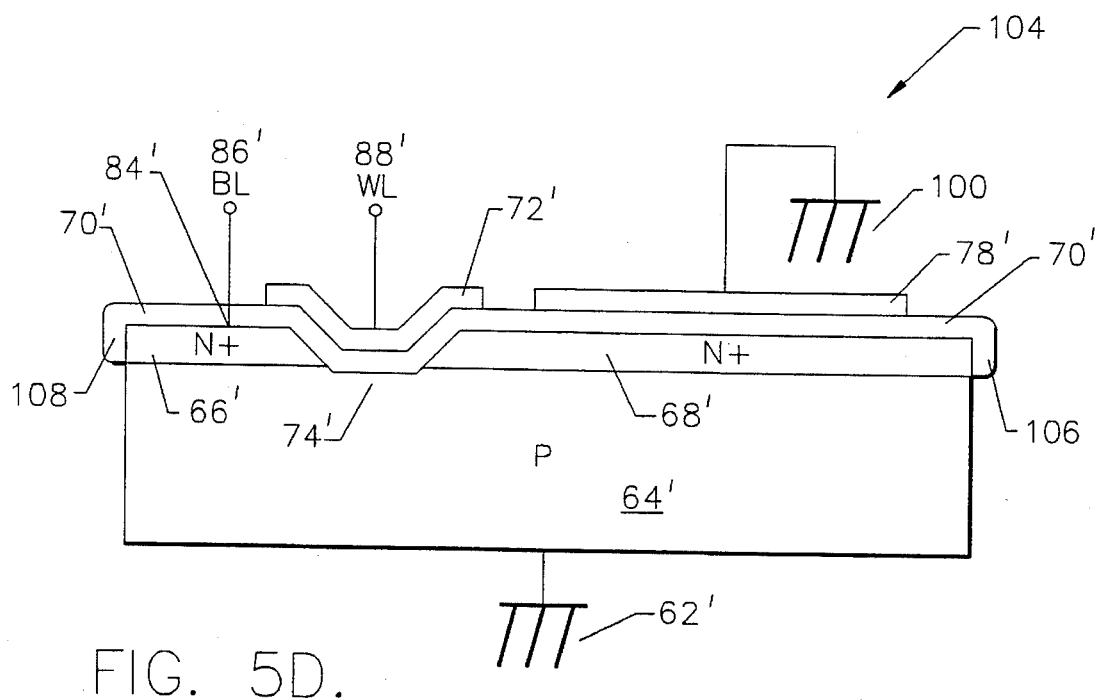

To accomplish this without ion implantation, the cell structure 104 of FIG. 5(d) is used. In this cell structure 104, the n+ regions 66', 68' are doped during epitaxial growth, and the channel region 74' of the MOSFET 76' is formed by a recess etch prior to gate oxidation. The conductive contact layer 78' is then layered over a portion of the drain region 68' of the MOSFET 76'. This structure 104 provides slightly higher charge storage density, since both the MOS capacitance and the capacitance of the n+p junction store charge. Also in this configuration, the silicon dioxide layer 70' has extended edges 106, 108 to isolate cells in an array.

Fabrication of MOS structures on 6H-SiC p-type layers has shown that dry oxides grown on the 6H-SiC generally have high fixed oxide charge levels, in the mid $10^{12}$ (cm)$^{-2}$ range, where cm is centimeters. Current-voltage (C-V) measurements also showed that these oxides had high leakage currents after annealing in Argon (Ar) at high temperature (900°–1000° Celsius (C)); these leakage currents were greatly reduced by annealing in Ar/4%H$_2$ instead of Ar. The dry oxide with the lowest value of $Q_{eff}$=4–5×10$^{12}$ cm$^{-2}$ was grown at 1300° C.

Figure 6:
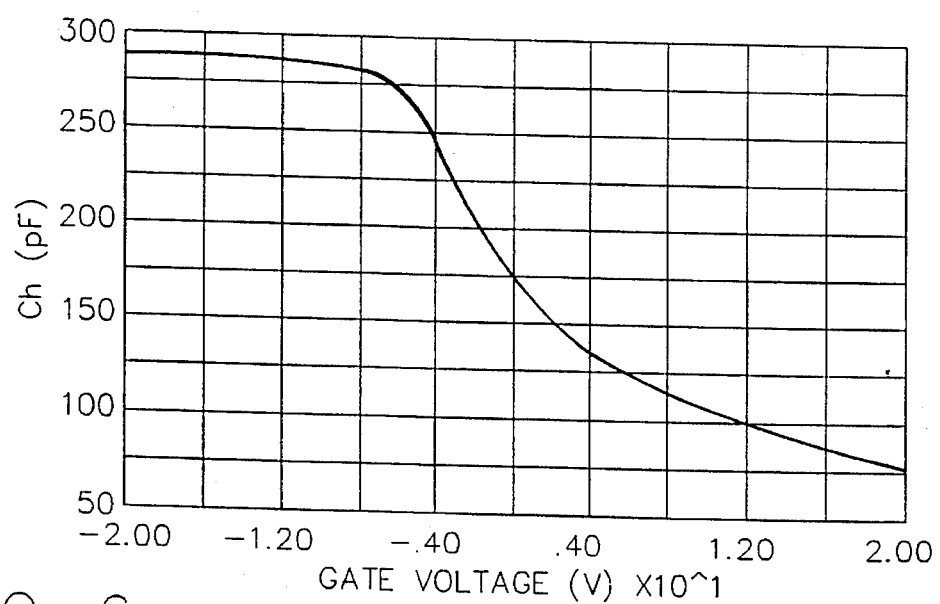
FIG. 6 graphically illustrates the capacitance-voltage (C-V) curve of a p-type silicon carbide MOS capacitor as measured by a mercury (Hg) probe.

The MOS C-V measurements of 6H-SiC samples after wet oxidation were much more encouraging. The C-V curve in FIG. 6 shows the typical characteristics of the samples, particularly grown on the Si-face, that were measured by a mercury (Hg) probe. This particular oxide was grown at 1100° C. in wet O$_2$ for 360 minutes, resulting in an oxide thickness of 49.5 nanometers (nm). The flatband voltage ($V_{FB}$) and threshold voltage ($V_T$) were measured to be $-5.4$ Volts (V) and $+1.5$ V, respectively, corresponding to a fixed oxide charge ($Q_{eff}$) of $1.2\times10^{12}$ cm$^{-2}$. This curve was virtually identical in either sweep direction.

Another positive trend observed for the wet oxides grown on the Si-face was that the higher the oxidation temperature, the lower the $Q_{eff}$ after subsequent contact annealing at 925° C. The $V_{FB}$ and $V_T$ of a wet oxide grown at 1100° C. and annealed in Ar/4%H$_2$ was $-16.3$ V and $-9.7$ V while the $V_{FB}$ and $V_T$ of a wet oxide grown at 1300° C. and annealed was $-10.0$ V and $+1.3$ V. The average measured fixed oxide charges for oxides grown at 1100° C., 1200° C., and 1300° C. and subsequently annealed were 5.5×10$^{12}$ cm$^{-2}$, 3.8×10$^{12}$ cm$^{-2}$ and 2.6×10$^{12}$ cm$^{-2}$, respectively. Based on these results, the best processing conditions for the n-channel 6H-SiC MOSFETs were found to be wet oxidation at 1300° C. followed by a 925° C. anneal in Ar/4%H$_2$.

Concurrent with the MOS capacitor research, n-channel 6H-SiC MOSFET research was also conducted. Many iterations of n-channel 6H-SiC enhancement mode MOSFETs were fabricated before finally obtaining acceptable results. The earlier MOSFETs that were fabricated had room temperature threshold voltages ($V_T$) in the range of +8 V to +1 V and with a gate voltage of +24 V ($V_G-V_T$≈14 V), the maximum transconductance was only in the range of 0.20–0.25 milliSiemens (mS)/millimeter (mm) and the $I_{DSS}$ was about 1.6 milliamperes (mA)/mm. These characteristics changed dramatically with temperature, with the $V_T$ decreasing rapidly to +0.25 V and the maximum transconductance ($g_{max}$) increasing rapidly to 1.03 mS/mm as the measurement temperature was increased to 350° C. These results were also seen to a lesser extent for inversion-mode MOSFETs fabricated in β-SiC.

The inventors found that poor room temperature characteristics are related to high interface trap densities ($D_{it}$) at the SiO$_2$/SiC interface. Similar p-type 6H-SiC MOS structures were measured to have a $D_{it}$≈7×10$^{11}$ eV$^{-1}$cm$^{-2}$. Through improvements in the oxidation process, channel layer doping, and subsequent annealing, however, the interface trap density was reduced and an order of magnitude increase in room temperature transconductance was achieved for 6H-SiC MOSFETs.

Figure 7A:
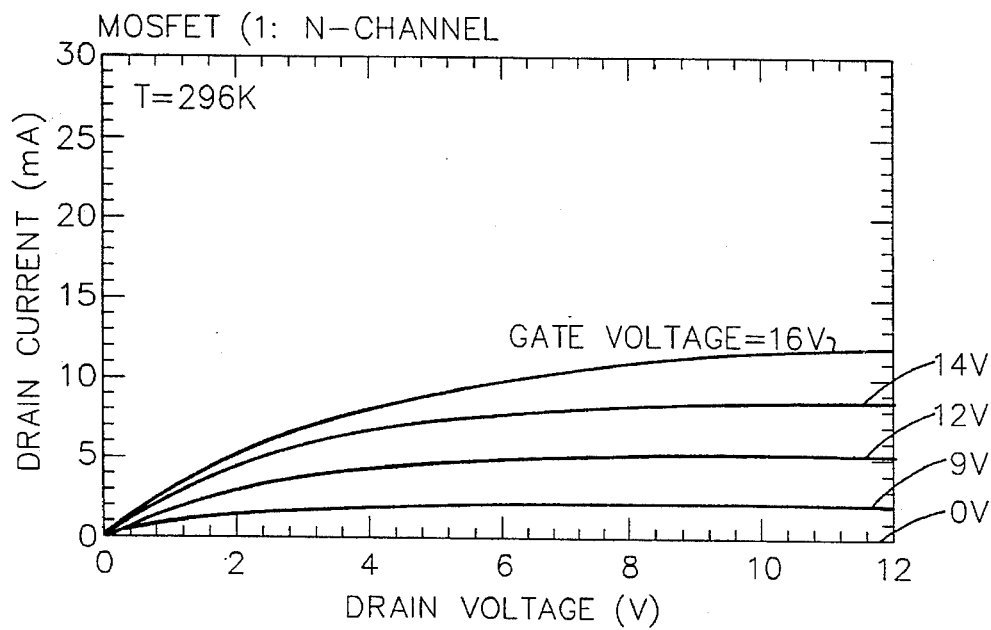
FIGS. 7(a)-7(c) graphically illustrate the current-voltage characteristics of an enhancement-mode n-channel 6H-SiC MOSFET with improved transfer characteristics according to the present invention.
Figure 7B:
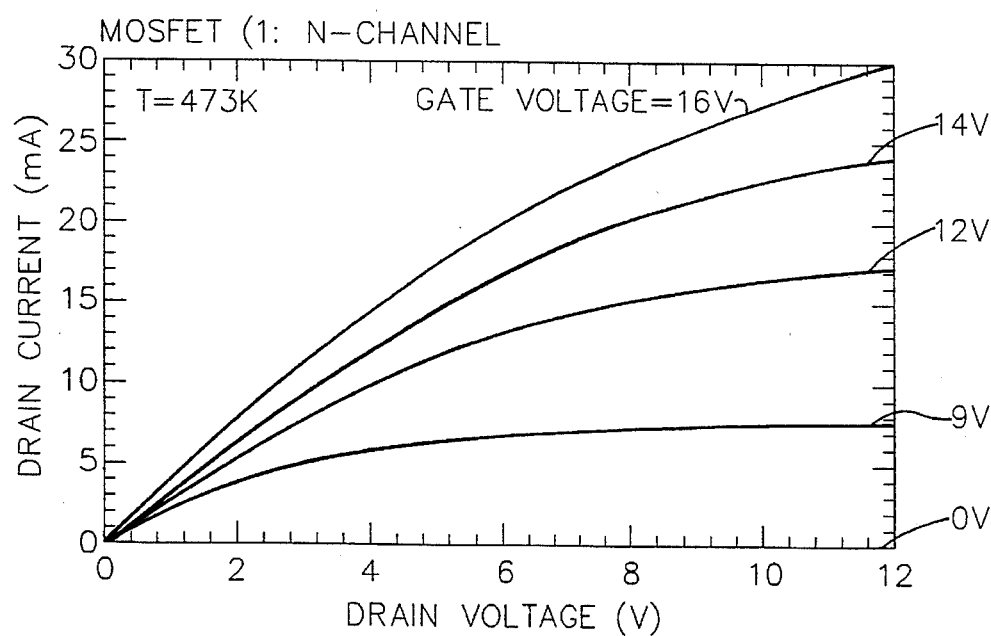
Figure 7C:
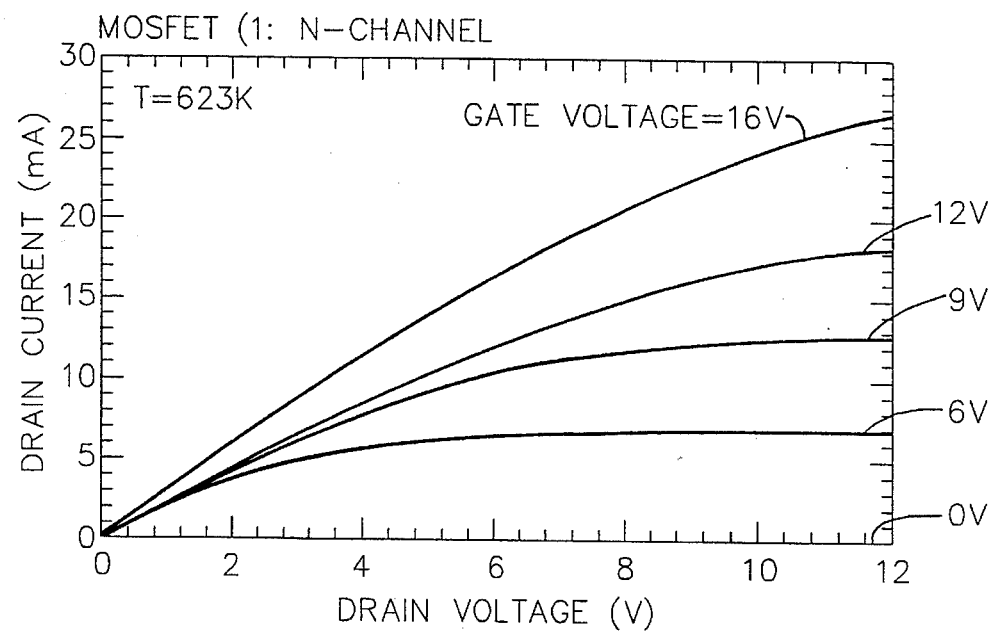

The current-voltage characteristics of an enhancement-mode n-channel 6H-SiC MOSFET with improved transfer characteristics is shown in FIGS. 7(a)–7(c). At room temperature, FIG. 7(a), the saturation current was 12.5 mA at $V_G$=16 V and the threshold voltage was +3.6 V. This relatively high value of threshold voltage is desirable for nonvolatile memory operation, since subthreshold leakage decreases exponentially with gate voltage below threshold. The maximum transconductance ($g_{max}$) was 2.15 mS/mm at $V_G$=16 V. The subthreshold leakage current at $V_D$=12 V and $V_G$=0 V was 1.95 µA.

At 200° C., FIG. 7(b), the saturation current at $V_G$=16 V increased to 30 mA and the threshold voltage decreased to +0.4 V. The transconductance at a fixed value of ($V_G-V_T$) remained relatively constant compared to the room temperature value, while the subthreshold leakage increased to 9.5 µA, largely due to the decrease in $V_T$.

At 350° C., FIG. 7(c), the saturation current decreased slightly to 27 mA at $V_G$=16 V and the threshold voltage decreased to +0.2 V. The transconductance decreased to 2.25 mS/mm, but the subthreshold leakage current remained stable at 9.5 µA.

MOSFET's of this type were operated at temperatures as high as 650° C. with very little degradation in I-V characteristics. These temperatures are, of course, well beyond those envisioned in this work, and the data is included here to indicate the extreme stability and reliability of SiC MOSFET's.

Figure 8:
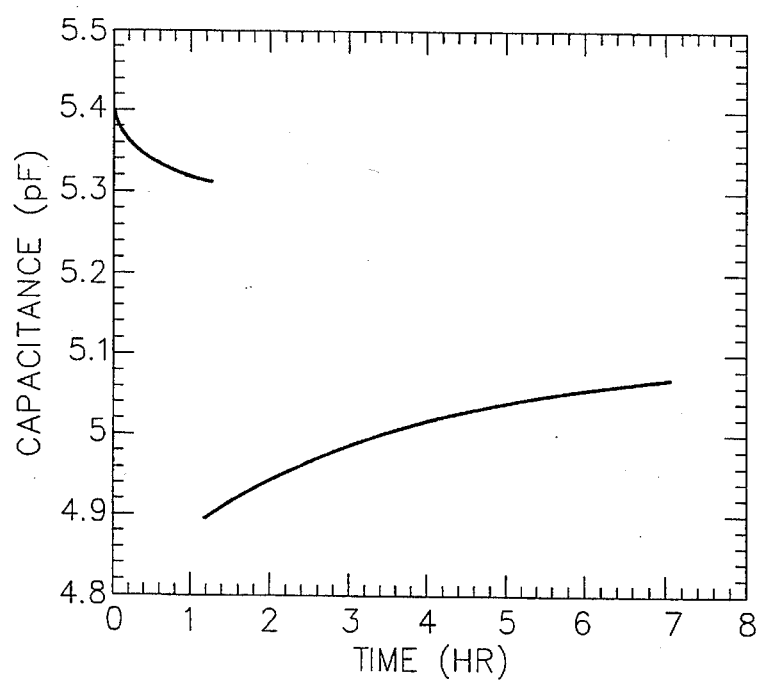
FIG. 8 graphically illustrates the capacitance-time (C-t) transients obtained at 159° Celsius for 6H-SiC n-p-n storage capacitors.

As mentioned earlier, the inventors performed initial experiments on n-p-n storage capacitors in 6H-SiC (MOS). These structures are shown in FIG. 1(c), and capacitance-time (C-t) transients obtained at 159° C. are shown in FIG. 8 to illustrate how these transients were measured. Even at this high temperature, the voltage on the storage capacitor does not fully decay during the 8-hour C-t transient. The 1/e storage time, however, may be estimated by curve-fitting to be on the order of 1.5 hours at 250° C.

From this data assuming half-bandgap activation energy, the storage time was found to be on the order of 300,000 years at room temperature. As stated earlier, this calculation indicated that the generation mechanism which is dominant at 159° C. will be totally insignificant at room temperature.

It is understood by those having skilled in the art that the bipolar NVRAM and the MOS NVRAM cell configurations of the present invention may be used to fabricate a master cell for reproduction, multiple cells, or an array of cells for a single or multiple memory device.

In the drawings and specification, there have been disclosed typical preferred embodiments of the invention and, although specific terms are employed, the terms are used in a generic and descriptive sense only and not for purposes of limitation, the scope of the invention being set forth in the following claims.

That which is claimed is:

1. A nonvolatile random access memory (NVRAM) device having memory storage for substantially indefinite periods of time even in the absence of refresh, said NVRAM device comprising:
   a bit line for writing information to storage when a potential is applied thereto; and
   means for storing a charge for substantially indefinite periods of time, said means including a transistor formed of silicon carbide, said transistor connecting said charge storage means to said bit line so that the NVRAM device stores the charge for substantially indefinite periods of time even in the absence of refresh.

2. A NVRAM device according to claim 1 further comprising a word line connected to said transistor for communicating with bit line data from said bit line.

3. A NVRAM device according to claim 2 wherein said bit line data comprise a voltage high or voltage low for defining a logic one or logic zero.

4. A NVRAM according to claim 1 wherein said silicon carbide has a polytype selected from the group consisting of 3C, 2H, 4H, 6H, and 15R.

5. A nonvolatile random access memory (NVRAM) cell having memory storage for substantially indefinite periods of time even in the absence of refresh, said NVRAM cell comprising:
   a bipolar transistor formed in silicon carbide having a base region, an emitter region, and a floating collector region;
   a charge storage device formed of silicon carbide and formed from said floating collector region of said bipolar transistor; and
   a bit line connected to said emitter region of said bipolar transistor for writing data to and reading data from NVRAM cell so that the NVRAM cell stores the data for substantially indefinite periods of time even in the absence of refresh.

6. A NVRAM cell according to claim 5 further comprising a word line connected to said base region of said bipolar transistor for communicating with bit line data from said bit line.

7. A NVRAM cell according to claim 5 wherein said bit line data comprise a voltage high or voltage low for defining a logic one or logic zero.

8. A NVRAM cell according to claim 5 wherein said charge storage device is electrically connected to said floating collector region of said bipolar transistor.

9. A NVRAM cell according to claim 5 and further comprising ohmic contacts to said base and to said emitter regions of said bipolar transistor for biasing said bipolar transistor, wherein said biasing comprises a forward bias applied from said base region to said floating collector region to encourage a flow of carriers from said floating collector region to said base region so that an electrical charge will form in said charge storage device under said forward bias, and said charge storage device will retain said electrical charge when said forward bias is removed.

10. The NVRAM cell according to claim 6 wherein said word line comprises an ohmic contact to said base region.

11. The NVRAM cell according to claim 5 wherein said bit line comprises an ohmic contact to said emitter region.

12. A NVRAM according to claim 5 wherein said silicon carbide has a polytype selected from the group consisting of 3C, 2H, 4H, 6H, and 15R.

13. A nonvolatile random access memory (NVRAM) cell having memory storage for substantially indefinite periods of time even in the absence of refresh, said NVRAM cell comprising:
   a metal-oxide-semiconductor field effect transistor (MOSFET) formed in silicon carbide having a gate region, a source region, and a drain region;
   a charge storage device formed in said drain region of said MOSFET;
   a bit line connected to said source region of said MOSFET for reading data from and writing data to said NVRAM cell so that the NVRAM cell stores the data for substantially indefinite periods of time even in the absence of refresh.

14. A NVRAM cell according to claim 13 further comprising a word line connected to said gate region of said MOSFET for communicating with bit line data from said bit line.

15. A NVRAM cell according to claim 14 wherein said bit line data comprise a voltage high or voltage low for defining a logic one or logic zero.

16. A NVRAM cell according to claim 14 wherein said word line comprises a gate contact layer to said gate region.

17. A NVRAM cell according to claim 13 wherein said charge storage device comprises a conductive contact layer on said drain region for defining a metal-oxide-semiconductor (MOS) capacitor.

18. A NVRAM cell according to claim 13 wherein said charge storage device is electrically connected to said drain region of said MOSFET.

19. A NVRAM cell according to claim 13 further comprising contacts to said gate and source regions of said MOSFET for biasing said MOSFET, wherein said biasing comprises a bias applied to said gate region to encourage a flow of carriers from said drain region through said gate region to said source region so that an electrical charge will form in said charge storage device under said bias, and said charge storage device will retain said electrical charge when said bias is removed.

20. A NVRAM cell according to claim 13 wherein said bit line further comprises an ohmic contact to said source region.

21. A NVRAM according to claim 13 wherein said silicon carbide has a polytype selected from the group consisting of 3C, 2H, 4H, 6H, and 15R.

22. A nonvolatile random access memory (NVRAM) device having memory storage for substantially indefinite periods of time even in the absence of refresh, said NVRAM device comprising:
   an array of silicon carbide memory cells arranged in a plurality of rows and columns, each silicon carbide memory cell comprising a transistor having a base region, an emitter region, and a floating collector region, and a charge storage device adjacent said floating collector region;
   a plurality of word lines, a respective one of which is connected to said base region of each one of all of said silicon carbide memory cells in a respective row;
   a plurality of bit lines, a respective one of which is connected to said emitter region of each one of all of said silicon carbide memory cells in a respective column; and
   means connected to said word lines for activating said transistors in a selected row to thereby transfer a charge on said charge storage devices in said selected row onto said bit lines so that each memory cell of said NVRAM device stores the charge for substantially indefinite periods of time even in the absence of refresh.

23. A NVRAM according to claim 22 wherein said silicon carbide has a polytype selected from the group consisting of 3C, 2H, 4H, 6H, and 15R.

24. A method of fabricating a NVRAM device comprising:

producing a mask having a NVRAM array configuration according to claim 22; and fabricating a NVRAM array therefrom on a substrate.

25. A method of fabricating a NVRAM device comprising:

producing a master NVRAM array having a configuration according to claim 22; and replicating a plurality of NVRAM arrays therefrom on a corresponding substrate.

26. A nonvolatile random access memory (NVRAM) device having memory storage for substantially indefinite periods of time even in the absence of refresh, said NVRAM device comprising:

an array of silicon carbide memory cells arranged in a plurality of rows and columns, each silicon carbide memory cell comprising a transistor having a gate region, a source region, and a drain region, and a charge storage device adjacent said drain region;

a plurality of word lines, a respective one of which is connected to said gate region of each one of all of said silicon carbide memory cells in a respective row;

a plurality of bit lines, a respective one of which is connected to said source region of each one of all of said silicon carbide memory cells in a respective column; and means connected to said word lines for activating said transistors in a selected row to thereby transfer a charge on said charge storage devices in said selected row onto said bit lines so that each memory cell of said NVRAM device stores the charge for substantially indefinite periods of time even in the absence of refresh.

27. A NVRAM according to claim 26 wherein said silicon carbide has a polytype selected from the group consisting of 3C, 2H, 4H, 6H, and 15R.

28. A method of fabricating a NVRAM device comprising:

producing a mask having a NVRAM array configuration according to claim 26; and fabricating a NVRAM array therefrom on a substrate.

29. A method of fabricating a NVRAM device comprising:

producing a master NVRAM array having a configuration according to claim 26; and replicating a plurality of NVRAM arrays therefrom on a corresponding substrate.

30. A nonvolatile random access memory (NVRAM) device having memory storage for substantially indefinite periods of time even in the absence of refresh, said NVRAM device comprising:

a bit line for writing information to storage when a potential is applied thereto; and means for storing a charge for substantially indefinite periods of time, said means including a charge storage device formed of silicon carbide and a transistor formed of silicon carbide connecting said charge storage device to said bit line so that the NVRAM device stores the charge for substantially indefinite periods of time even in the absence of refresh.

31. A NVRAM device according to claim 30, further comprising means for restricting dissipation of the charge from the NVRAM device.

32. A NVRAM device according to claim 30, wherein said silicon carbide has a polytype selected from the group consisting of 3C, 2H, 4H, 6H and 15R silicon carbide.

33. A nonvolatile random access memory (NVRAM) device having memory storage for substantially indefinite periods of time even in the absence of refresh, said NVRAM device comprising:

a bit line for writing information to storage when a potential is applied thereto;

means for storing a charge for substantially indefinite periods of time, said means including a charge storage device and a transistor formed of silicon carbide connecting said charge storage device to said bit line; and means cooperating with said charge storage means for restricting dissipation of the charge from the NVRAM device so that the NVRAM device stores the charge for substantially indefinite periods of time even in the absence of refresh.

34. A NVRAM device according to claim 33, wherein said means for restricting dissipation comprises an oxide layer formed adjacent said silicon carbide.

35. A NVRAM device according to claim 33, wherein said silicon carbide has a polytype selected from the group consisting of 3C, 2H, 4H, 6H and 15R silicon carbide.

* * * * *